United States Patent [19]

Lawton et al.

[11] 4,030,840
[45] June 21, 1977

[54] WAVEFORM SAMPLER

[75] Inventors: Robert A. Lawton, Boulder; James R. Andrews, Lafayette, both of Colo.

[73] Assignee: The United States of America as represented by the Secretary of the Air Force, Washington, D.C.

[22] Filed: Mar. 25, 1976

[21] Appl. No.: 670,468

[52] U.S. Cl. .............................. 356/256; 250/210; 324/121 R

[51] Int. Cl.² ......................................... G01R 13/34

[58] Field of Search .......... 324/121, 123, 126, 129, 324/134, 140, 149, 72.5; 250/210, 578; 356/217, 218, 222, 256

[56] References Cited

UNITED STATES PATENTS 3,925,727  12/1975  Duguay .................... 324/121 R

OTHER PUBLICATIONS

Andrews, "Inexpensive Laser Diode Pulse Generator for Optical Waveguide Studies," *Rev. Sci. Instrum.*, vol. 45, No. 1, pp. 22–24, Jan. 1974.

Lawton et al., "Photoconductive Detector of Fast–Transition Optical Waveforms," *Electronics Letters*, vol. 11, No. 4, pp. 74–75, 20 Feb. 1975.

Lawton et al., "Pulsed–Laser Application to Sampling Oscilloscope," *Electronic Letters*, vol. 11, No. 7, p. 138, 3 Apr. 1975.

*Primary Examiner*—Edward S. Bauer
*Assistant Examiner*—Matthew W. Koren
*Attorney, Agent, or Firm*—Joseph E. Rusz; Robert Kern Duncan

[57] ABSTRACT

A waveform sampler, for cooperation with a conventional sampling oscilloscope, has, as part of a bridge circuit, two Gallium Arsenide photoconductors mounted on a 50 ohm stripline. One GaAs photoconductor, the sampling photoconductor, is illuminated. The other GaAs photoconductor remains dark and functions as a common mode compensating photoconductor. To sample an unknown electrical waveform traversing the stripline the electrical wave is optically strobed by illuminating the sampling GaAs photoconductor with pulses of light from a laser. To sample an unknown optical waveform the optical wave is focused on the sampling GaAs photoconductor and an electrical strobe signal is sent through the stripline. Outputs from each of the photoconductors are amplified in high input impedance FET amplifiers and after electrical compensation they are passed to a conventional difference amplifier. The difference output is further amplified and fed to a conventional sampling oscilloscope. The sampling oscilloscope provides a conventional DC feedback control voltage to stabilize the bridge circuit and a strobe synchronization pulse for controlling either the electrical or optical strobe. A trigger pulse that is in advance of the signal being sampled is derived from the unknown signal and supplied to the sampling oscilloscope.

6 claims, 25 Drawing Figures

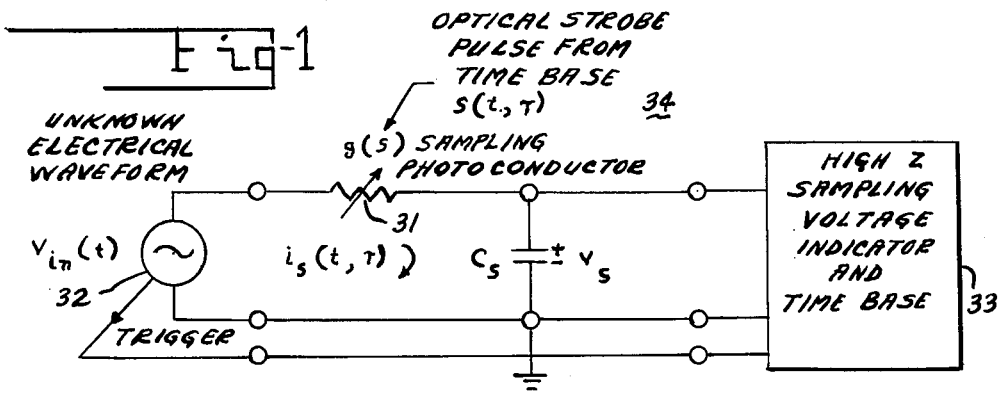
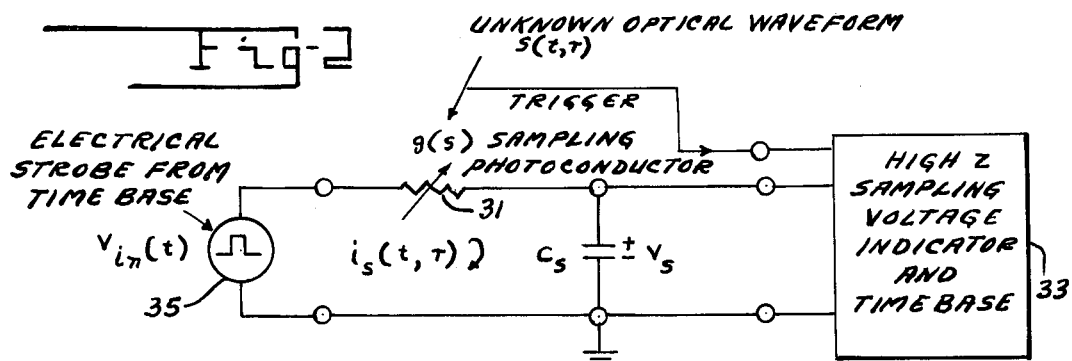
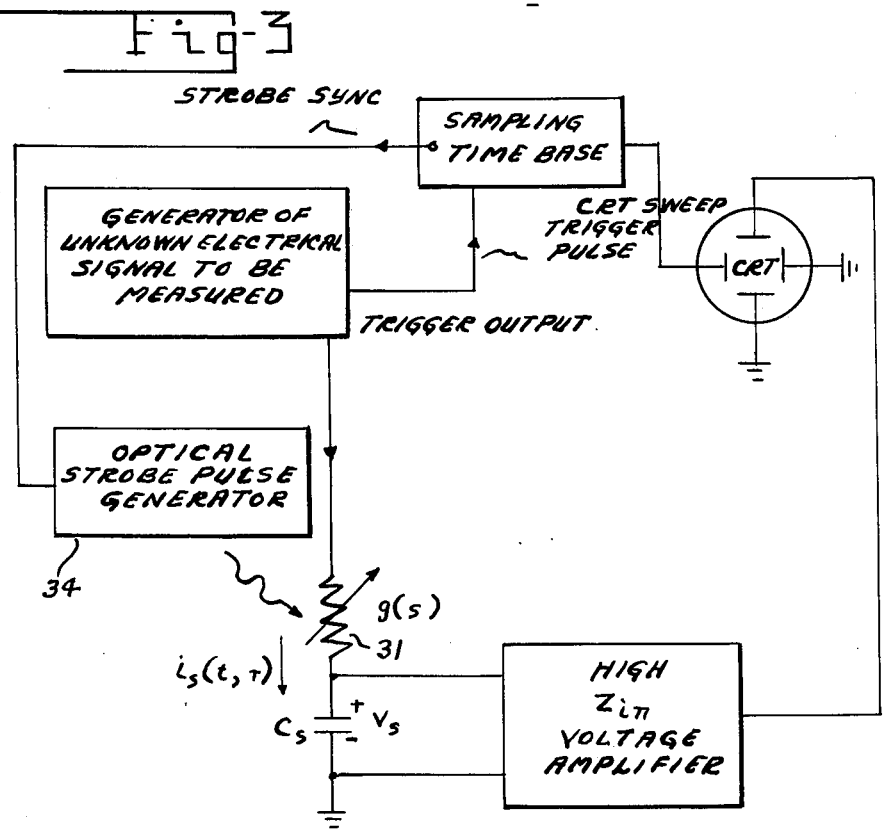

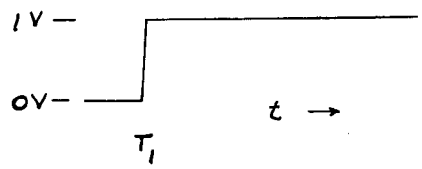
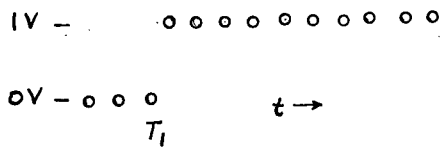
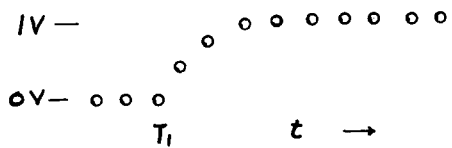
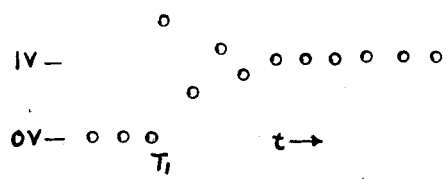

WAVEFORM SAMPLER

RIGHTS OF THE GOVERNMENT

The invention described herein may be manufactured and used by or for the Government of the U.S. for all governmental purposes without the payment of any royalty.

BACKGROUND OF THE INVENTION

The field of the invention is in the electrical instrumentation art and more particularly in the art of sampling oscilloscopes.

Sampling oscilloscopes are well known. When utilized to measure repeating high frequency electrical waveforms, such devices conventionally employ an electrically strobed probe which samples small sequential portions of successive waveforms. Thus, the cumulative result of this sampling technique provides a composite waveform readout representative of the subject waveforms.

However, certain drawbacks are involved. The electrical strobe of electrical signals often induces spurious results. The dynamic range of conventional probe sampling gates an usually quite limited, i.e., ± 1 volt. Though probes may be highly sensitive, the parasitic impedance of the oscilloscope input greatly limits the effective response. Thus, conventional sampling oscilloscopes generally are limited in bandwidth, are subject to spurious results from the strobe, and are limited as to dynamic range when high frequency waveforms are involved. Though the probe may be capable of relatively high speed sampling, the errors generated in providing the resulting signal to the oscilloscope, and particularly parasitic impedance errors, limit the dynamic sensitivity.

Optical switching devices per se are known. However, many of the optical switching devices, such as photodiodes are limited in performance. Further, even with adequate bandwidth and speed, the signals from conventional photosensors are again subject to the errors resulting from parasitic reactances.

In addition, while the electrical strobe is known, the use of such a strobe for measuring the time variation of optical waveforms without the necessity of an intermediate optical to electrical transducer, such as a photodiode, has not heretofore occurred.

A unique device capable of both optical strobing of electrical waveforms and electrical strobing of optical waveforms, as disclosed herein, therefore offers many advantages.

For additional background information helpful in understanding this invention reference is made to the following publications.

Lawton, R. A. and Andrews, J. R., "Pulsed-Laser Application to Sampling Oscilloscope," Electronics Letters, Vol. 11, No. 7, April 1975.

Lawton, R. A. and Scavannec, A. S., "A Photoconductive Detector of Fast Transition Waveforms", Electronics Letters, Vol. 11, pp 74–75, February 1975.

Andrews, J. R. and Baldwin E. E., "Baseband Impulse Generator Useful to 5 GHz,"1975 IEEE Electromagnetic Compatibility Symposium Record, October 1975, pages 6BId1–6BId4.

Andrews, J. R., "Inexpensive Laser Diode Pulse Generator for Optical Waveguide Studies", Rev. Sci. Instrum., Vol. 45, No. 1, January 1974.

R. Carlson et al, "Sampling Oscillography", Application Note 36, Hewlett-Packard Co.

SUMMARY OF THE INVENTION

A waveform sampling probe for use with a conventional sampling oscilloscope is disclosed. The disclosed invention provides an instrument that will accurately sample electrical and optical waveforms by optically gating with a light signal on a photoconductor the electrical wave traversing a stripline; and by electrically gating the optical signal impressed on a photoconductor with a strobe pulse in the stripline.

BRIEF DESCRIPTION OF THE DRAWING

FIG. 1 is a schematic diagram of a simplified equivalent circuit of an optically strobed electrical system for examining electrical waveforms;

FIG. 2 is a schematic diagram of a simplified equivalent circuit of an electrically strobed system for examining optical waveforms;

FIG. 3 is a simplified block-schematic diagram of an optically strobed system;

FIG. 22 is a calibration waveform for adjusting the apparatus of the invention;

FIG. 23 is a representative display on the indicating CRT of a system that has the correct value of sampling efficiency of 100%, FIG. 24 is the same as FIG. 23 except the sampling efficiency is less than 100%; and FIG. 25 shows improper adjustment wherein the sampling efficiency exceeds 100%.

DESCRIPTION OF THE PREFERRED EMBODIMENT

FIGS. 1 and 2 respectively show in the simplest form the equivalent circuits of systems for optically strobing an unknown electrical signal and electrically strobing an unknown optical signal and presenting a sampled representation of the unknown signal. Referring specifically to FIG. 1, and for the moment considering the operation of a sampling oscilloscope in general terms, i.e., element 31 in the Figure is considered as merely being a controlled variable resistance, the following analysis may be stated.

The unknown signal 32 to be measured is represented by $v_{in}(t)$ where $t$ represents real time. The sampling gate is the variable resistor 31 represented by the conductance function $g(s)$. A strobe, $s(t,\tau)$, from the oscilloscope time base 33 controls the sampling gate conductance. The instant of sampling is represented by the variable, $\tau$. For time prior to $\tau$, the gate is closed, i.e., $g = 0$. At $t = \tau$ the strobe opens the gate allowing current, $i_s(t,\tau)$, to flow. This current deposits charge on the sampling capacitor, $C_s$. When the gate is again closed a dc voltage, $V_s$, remains on $C_s$ that is proportional to the signal input at the instant of sampling. $V_s$ is them measured by a high impedance voltmeter and displayed on the CRT screen of the indicator and time base 33 as a single dot.

A single sample is taken of the input waveform each time the waveform recurs. The time base automatically increments $\tau$ by a small amount, $\Delta\tau$, after each recurrence so that the waveform is successively sampled at a different point in time each time it recurs. The original waveform is thus converted to an equivalent waveform, $V_s(\tau)$, that is stretched into an equivalent time variable $\tau$.

In the prior art practical devices the actual sampling gate variable conductance, $g(s)$, is conventionally one of several different components. At low frequencies in the kilohertz and megahertz region, vacuum tubes, diodes, transistors or FETs are used. In the gigahertz and subnanosecond region, commercial sampling oscilloscopes use balanced diode bridges in 2, 4, or 6 diode configurations. The diodes are normally reverse biased. Upon command of the time base, a balanced set of strobe pulse generators produce narrow voltage impulses large enough to forward bias all of the diodes. This has the effect of a switch momentarily connecting the signal input to the sampling capacitor, $C_s$. The dynamic range of the fast diode sampling gates is limited by the low reverse voltage breakdown of the diodes and the forward contact potential. Severe waveform distortion occurs when the input signal is large enough to cause a diode to conduct without being strobed, and electrical strobe kickout is caused by slight unbalances in the strobe generators and the bridge circuit.

Figure 4:
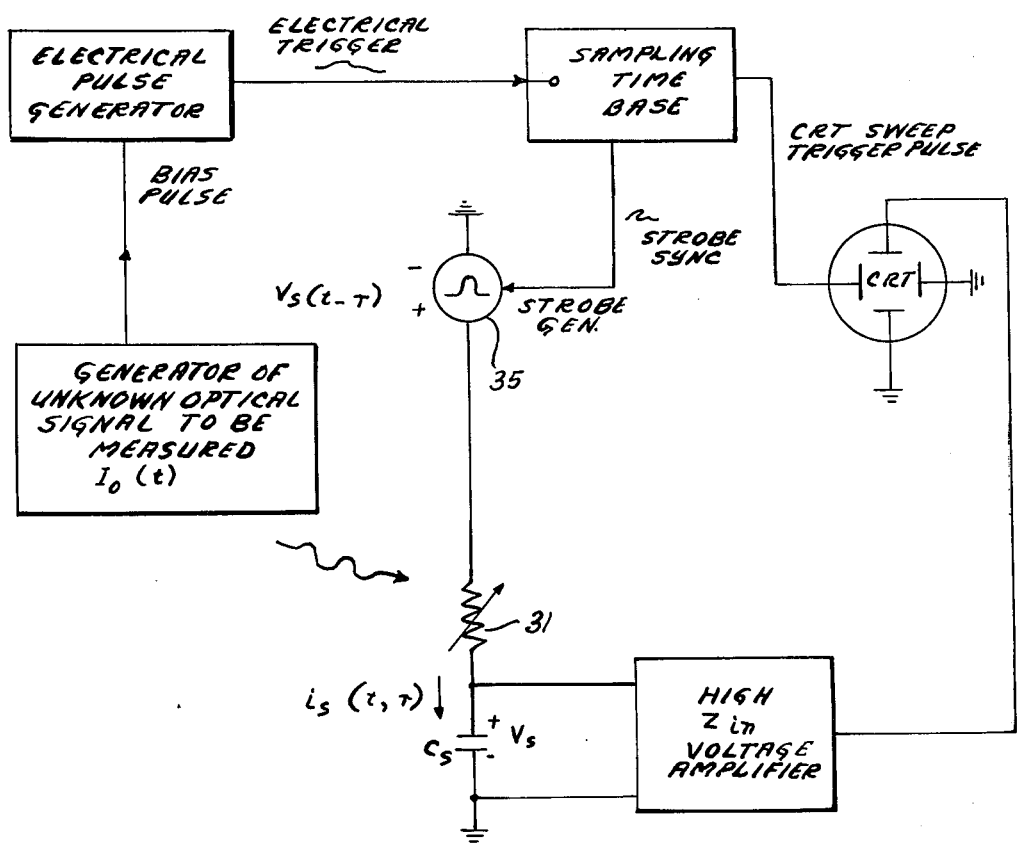
FIG. 4 is a simplified block-schematic diagram of an electrically strobed system.

The invention provides a new sampling head for connection with conventional sampling oscilloscopes. The new sampling system comprises a photoconductor for the variable resistance 31 of FIGS. 1, 2, 3, and 4 and the associated controlling and controlled circuits as will be progressively expanded in explanation in the following figures. In the waveform sampler for sampling an unknown electrical wave as represented in simplified schematic form in FIGS. 1 and 3, and in the waveform sampler for sampling an unknown optical wave as represented in FIGS. 2 and 4, the sampling gate 31 is a photoconductor. In the former the gate is illuminated by a controlled optical strobe 34. In the latter device (FIGS. 2 and 4), the photoconductor is illuminated with the unknown optical wave and the circuit is effectively strobed by a controlled electrical impulse 35. Considering the sampler for examining electrical waveforms (FIGS. 1 and 3), the time resolution achievable with such a sampling device is determined by the duration of the optical impulse and the free carrier lifetime of the photoconductor. Optical pulse durations of less than once picosecond have been achieved with a mode-locked dye laser, and free carrier lifetimes as short as 50 picoseconds or less have been demonstrated with GaAs photoconductors.

This type of sampling device has the advantage that the strobe impulse energy is optical and the sampled voltage will therefore be free from errors normally found in the conventional electrically operated sampling gate which are associated with the feedthrough of the strobe impulse to the sampling capacitor. Likewise, there is no kickout of the strobe. Also, the maximum permissible voltage of the waveform to be measured can be much greater than is the case with conventional sampling oscilloscopes, the dynamic range being limited only by voltage breakdown of the photoconductor. In addition, the linear V-I characteristic of a photoconductor eliminates the distortion errors found in an ordinary sampling gate caused by diode nonlinearities. Without going into further detail, those skilled in the art will readily comprehend that the same advantages exist for those systems represented by FIGS. 2 and 4 for observing high speed optical waveforms where the controlling strobe is an electrical pulse.

Another advantage common to both the optically strobed and electrically strobed probes is the enhanced sensitivity resulting from utilizing a sampling gate and capacitor as an integral part of the probe. By this arrangement, the initial signal developed at the probe need not be conducted substantial distances. In fact, stray capacitances which normally compromise sensitivity may be employed as a portion of the sample capacitor.

Figure 5:
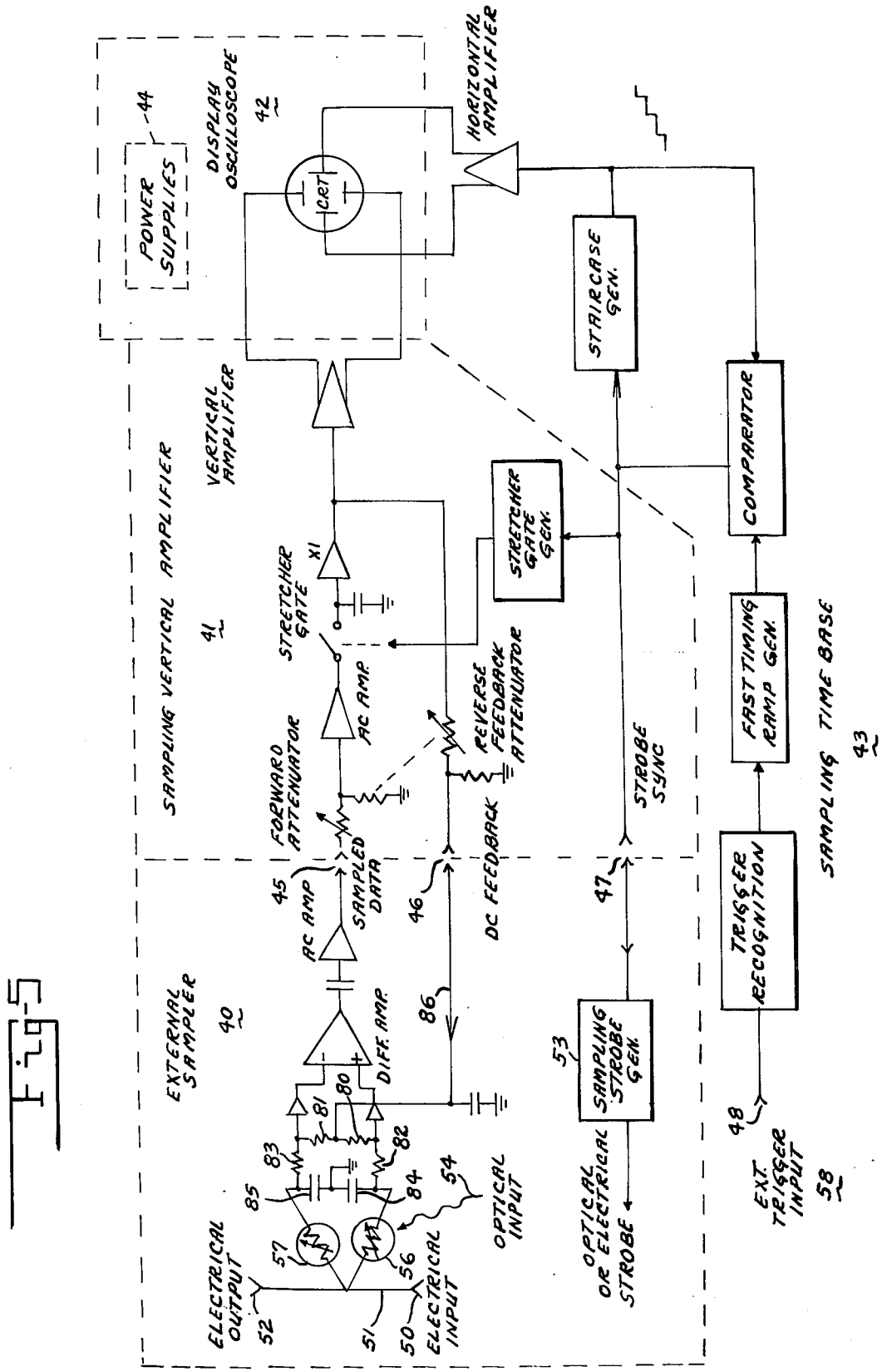
FIG. 5 is a simplified block-schematic diagram showing the cooperation of the major elements of a typical complete sampling oscilloscope system.

FIG. 5 is a complete and more detailed, but still a simplified schematic diagram for a complete system for displaying either unknown electrical waveforms, by optical strobing a photoconductor, or unknown optical waveforms by electrically strobing a photoconductor. The waveform sampler 40 is used directly with commercially available sampling oscilloscopes. The conventional sampling oscilloscope contains the sampling vertical amplifier 41, the display oscilloscope 42, the sampling time base 43, and the associated power supply systems 44. Connections 45, 46, 47, and 48 are available either in multiple conductor plugs or by input jacks or terminals. The individual component block and their arrangement in the commercially available apparatus are to be considered as typical and not limiting.

When the apparatus of FIG. 5 is used to examine an unknown electrical wave, the wave, which will conventionally by traversing a fifty ohm coaxial cable, is introduced at connector 50 and propogates stripline 51 to output terminal 52. Generally, the wave from terminal 52 progresses on to the utilization equipment which will provide the proper termination (50Ω). If instead of a series hookup a parallel or shunt connection is made to the unknown wave propogation medium, then the output 52 of the line 51 should be terminated in its characteristic impedance (in the specific embodiment of the invention described in detail, this is fifty ohms). The sampling strobe generator 53 receives a strobe snyc pulse at connector 47 from the conventional display apparatus, and provides an optical strobe pulse 54 for gating the sampling photoconductor 56. The balancing common mode compensation photoconductor 57 is shielded from any illumination and remains dark at all times.

For examining an unknown optical wave the wave 54 is focused on the photoconductor 56 and the sampling strobe generator supplies an electrical strobe pulse to the input 50 stripline 51. (The line is then conventionally terminated at its output 52.)

Figure 6:
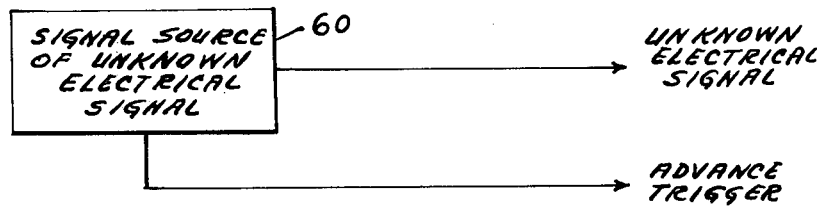
FIG. 6 is a simplified block diagram showing a signal source providing an unknown electrical signal and having an advanced trigger signal.
Figure 7:
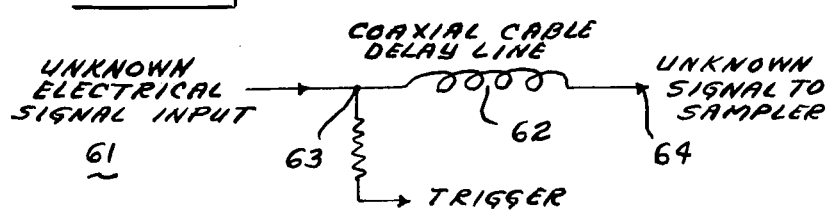
FIG. 7 is a schematic diagram showing a typical way of providing an advanced electrical trigger signal from an unknown electrical signal.

Conventional commercial sampling oscilloscopes generally require an external trigger 58 derived from, and in advance of, the unknown waveform being examined. In many instances this advance trigger is readily available from the unknown signal source 60 as illustrated for unknown electrical signals in FIG. 6. When a trigger signal in advance of the signal being sampled is not readily available a simple delay circuit as shown in FIG. 7 may conveniently be used. The unknown electrical signal 61 is generally propogating through a typically 50 ohm coaxial line toward a utilization circuit. The effectively advanced trigger signal is obtained by delaying the unknown signal prior to its entering the sampler. This may readily be accomplished by using an appropriate length of conventional coaxial cable 62 interspersed between the trigger takeoff 63 and the sampler input 64. The coaxial cable delay line 62 may be conveniently coiled to conserve space. A typical trigger advance (signal delay) requirement of a well known conventional sampling oscilloscope is 70 ns. This may be achieved with approximately 46.7 feet of conventional fifty ohm coaxial cable.

Figure 8:
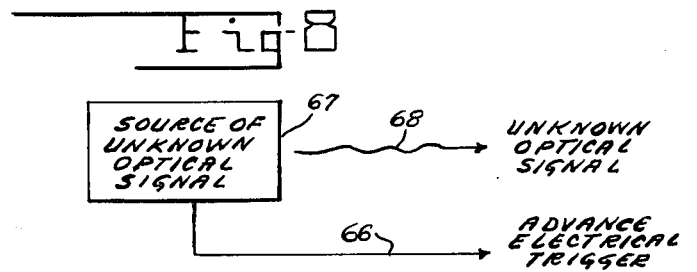
FIG. 8 is a simplified block diagram showing an optical source providing an unknown optical signal and having an advanced electrical trigger signal.
Figure 9:
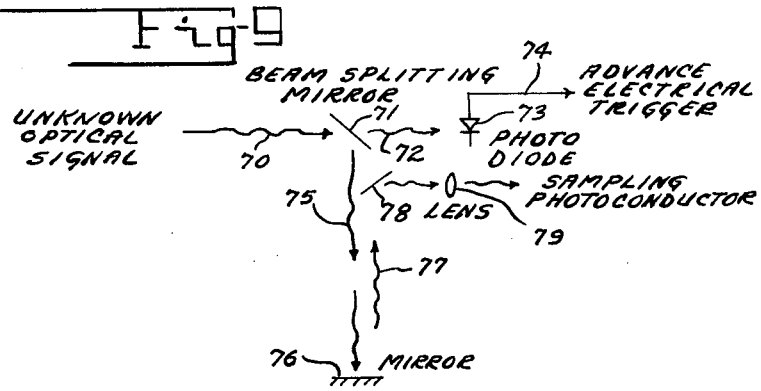
FIG. 9 is a simplified schematic-pictorial diagram showing a typical way of obtaining an electrical trigger that is advanced with respect to the unknown optical wave.

Likewise, it is generally a requirement when observing unknown optical waveforms that an electrical trigger be furnished the conventional sampling oscilloscope circuitry that is in advance of the optical signal being sampled. Again, quite frequently, as illustrated in FIG. 8, this advance trigger 66 is available from the source 67 of the unknown optical signal 68. However, an effectively advanced trigger signal may be established by delaying the unknown optical signal between the point of trigger derivation and the optical input to the sampler as shown in FIG. 9. Transit time delay is again used. The unknown optical signal 70 is passed through a conventional beam splitting mirror 71. Part of the signal 72 propagates through the mirror to the conventional photodiode detector 73 producing an electrical trigger signal on line 74. Part of the unknown optical beam 75 is reflected from the beam splitting mirror 71 to the conventional flat faced mirror 76. From the mirror 76 it is reflected to the mirror 78 which directs the beam through the focusing lens 79 onto the sampling photoconductor. A total path length difference from the beam splitting mirror to the photodiode and to the sampling photoconductor of approximately 70 feet will provide the typically required 70 ns delay of a tyical commercial sampling oscilloscope. Those practicing this invention will understand that the arrangement shown in FIG. 9 is merely illustrative of a typical convenient way of obtaining an advanced electrical trigger signal from an unknown optical signal and that it is not limiting in any way to the scope of the invention.

Referring again to FIG. 5 it is to be noted that a DC feedback voltage is available from the connection 46 of the commercial sampling oscilloscope. This DC feedback voltage is used with the apparatus of this invention in the same manner and in the same function as it is used with the conventional prior art sampling probes. The DC feedback voltage on line 86 flows through the feedback resistors 80 and 81 and the charging resistors 82 and 83 charging the sampling capacitor 84 and the common mode compensating capacitor 85 to the stretcher output voltage (less the calibration range attenuation set in the circuit) before the next sample is taken. This ensures that no charge will be deposited on the sampling capacitor during the next sampling interval unless the input voltage has changed since the last sampling interval. Thus, the feedback system maintains the sampling gate output voltage level to that value of the previous input signal, and if the input amplitude of the new sample is the same as that of the previous sample, no charge will be extracted from the input, no signal will be fed through the ac amplifier, no change will occur in the stored level on the capacitance, and consequently sampling efficiency will appear to be 100%. Using this method of balancing minimizes pedestral generation, input reaction, and loading from sampling; yet the gating circuits dynamic range is maximized.

Figure 11:
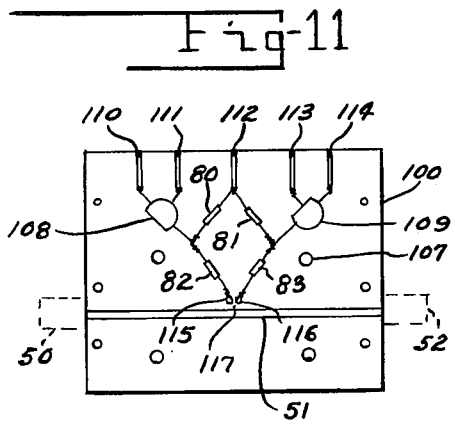
FIG. 11 pictorially represents a typical one-half stripline assembly showing the symmetrical positioning of the components on the center strip side of the stripline insulating board.
Figure 12:
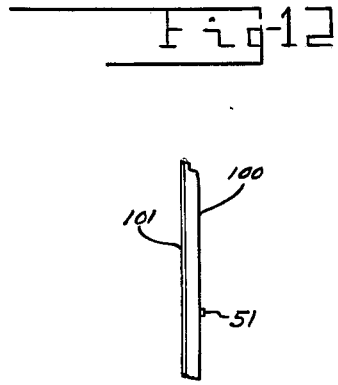
FIG. 12 is a partial end view of the stripline board of FIG. 11 showing the metal conductor backing and center strip.
Figure 13:
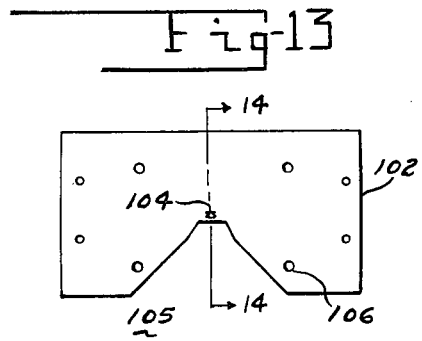
FIG. 13 is a pictorial representation of a typical cover board and ground plane structure for the other half of the assembly of FIG. 11 having a recess for receiving the dual photoconductor chip.
Figure 14:
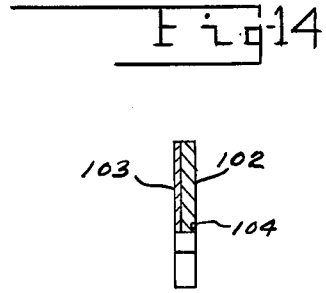
FIG. 14 is a section view through the center of the board and photoconductor chip recess shown in FIG. 13.
Figure 10:
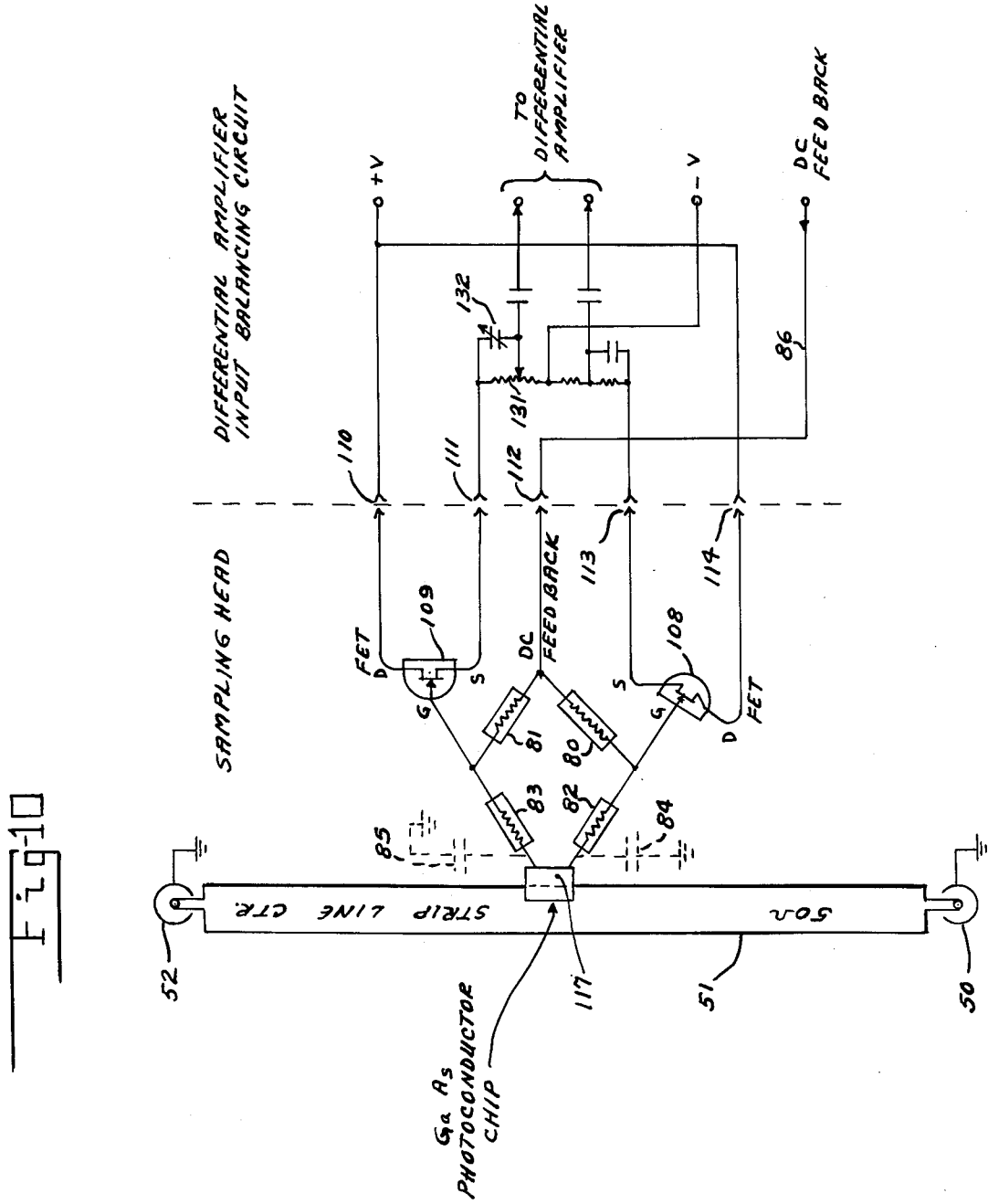
FIG. 10 is a representative pictorial schematic diagram showing a section of the center conductor of a 50Ω stripline transmission line with the photoconductor pair in place and a typical high input impedance FET amplifier pair with an electrical balancing circuit.

The sampling head (or probe) as illustrated in FIGS. 10 through 15 is constructed on conventional 50 ohm stripline board. FIG. 10 is principally a schematic wiring diagram with the head components positioned in the schematic representative of the actual physical placement. FIG. 11 is a typical physical layout of the components on the board of the stripline that has the center conductor 51. The actual stripline fabrication is conventional. Insulating board 100 has conventional metal backing 101 and center strip 51 as shown in the side view shown in FIG. 12. Conventional metallic backed cover board 102 has metal backing 103 and recess 104 in the insulating board to receive the photoconductor chip as illustrated in FIGS. 13 and 14. The cover board is cut out 105 so as to provide clearance for the components mounted on board 100 when it (board 102) is positioned on top of board 100 such that clamping and mounting hole 106 lines up with hole 107 (and likewise an allignment of the remaining clamping and mounting holes), thus forming a conventional stripline construction of a center conductor positioned between two insulating boards each backed with conductive material. In a typical embodiment of the invention fifty ohm characteristic stripline is used (and generally preferred), thus the line is conventionally physically dimensioned accordingly.

It is highly desirable that substantially a symmetrical layout of the components be made. This is particularly true because the sampling capacitor 84 and the common mode compensating capacitor 85 are not separate discrete components but are capacitances formed inherently in the physical arrangement of the components. (Stray or leakage capacitance is a term that is commonly applied to capacitance existing due to the physical arrangement of associated components and not formed by a specific component.) For the foregoing reason these capacities are quite small approximately 1 pf and they are represented in dotted form in FIG. 10 and not shown in the pictorial representation of FIG. 11. The high input impedance FET transistors 108 and 109 are positioned on the board in symmetrical arrangement. Coaxial line coupling connectors 50 and 52 are physically and electrically attached to the stripline ground planes 101 and 103 and to the center conductor 51 in the conventional manner. Conventional wire leads to the amplifier are soldered to the connecting strips 110, 111, 112, 113, and 114.

The recess 104 in the cover board receives the semiconductor chip on which the two photoconductors are formed. Metal contact strips 115 and 116 make electrical contact with the contact surfaces on the chip. A small hole 117 is fabricated through the board 100 so that illumination may reach the sampling photoconductor formed in the semiconductor chip. By nature of the physical construction the common mode compensating photoconductor is effectively shielded from all illumination. These last construction features may be further understood by reference to FIG. 15.

Figure 15:
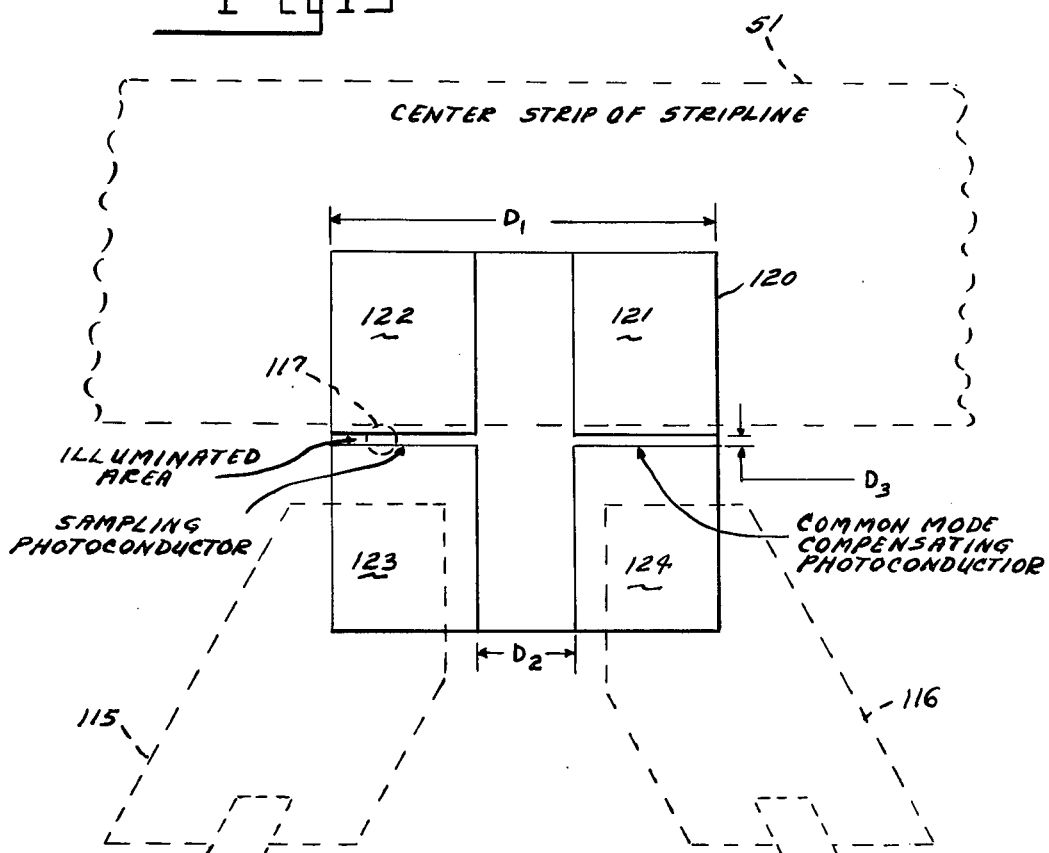
FIG. 15 is a greatly enlarged pictorial view of a photoconductor chip showing the sampling photoconductor and the common mode compensating photoconductor.

Desired characteristics for the sampling chip 120 (FIG. 15) are low signal transmission in the off, or dark state, and fast response or short lifetime (in the conductivity cutoff sense) together with high mobility. To obtain that characteristic, high resistivity Cr-doped gallium arsenide as commercially available, was chosen as the preferred photoconductive material. A balanced sampling chip was fabricated by evaporating gold germanium electrodes 121, 122, 123, and 124 onto a GaAs substrate as shown in FIG. 15. The dashed lines represent the positioning, with respect to the sampling chip, of the center strip 51 of the 50 ohm strip transmission line through which the signal to be measured is transmitted and the contacting strips 115 and 116. The chip is imbedded in the dielectric of the stripline 102 and makes pressure contact to the center strip 51 and contact strips 115 and 116 through the gold electrodes. (In the view shon in FIG. 15, the dotted elements are positioned on top of, not behind, the chip.)

In a typical embodiment of the invention the approximately square GaAs photoconductor chip had approximately the following dimensions $D_1$ equal 1100 $\mu$m, $D_2$ equal 250 $\mu$m, and $D_3$ equal to 25 $\mu$m.

The two narrow gaps (25 $\mu$m) between contacts consist of bare GaAs substrate and are the two photoconductive sampling resistors, one of which is illuminated. The other resistor is not illuminated and the signal leaking through it is subtracted from the signal leaking through the sampling resistor in the off or closed state thereby reducing common-mode distortion. The appropriate information from each resistor is fed to the two inputs of a pre-amplifier through the contact electrodes 123 and 124 contacting the contact strips 115 and 116 respectively.

Figure 16:
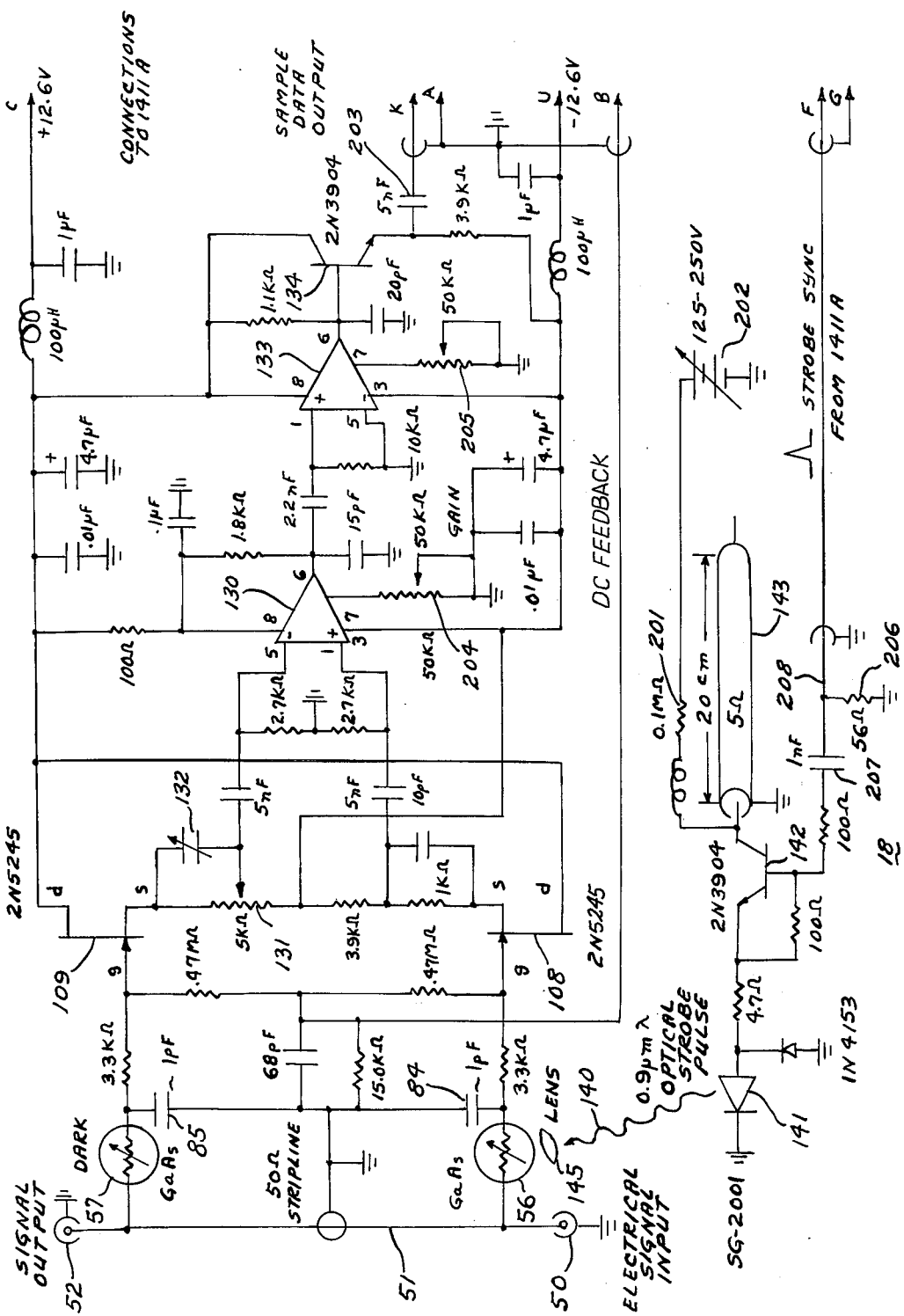
FIG. 16 is a detailed schematic wiring diagram of an embodiment of an optically strobed sampling probe.
Figure 17:
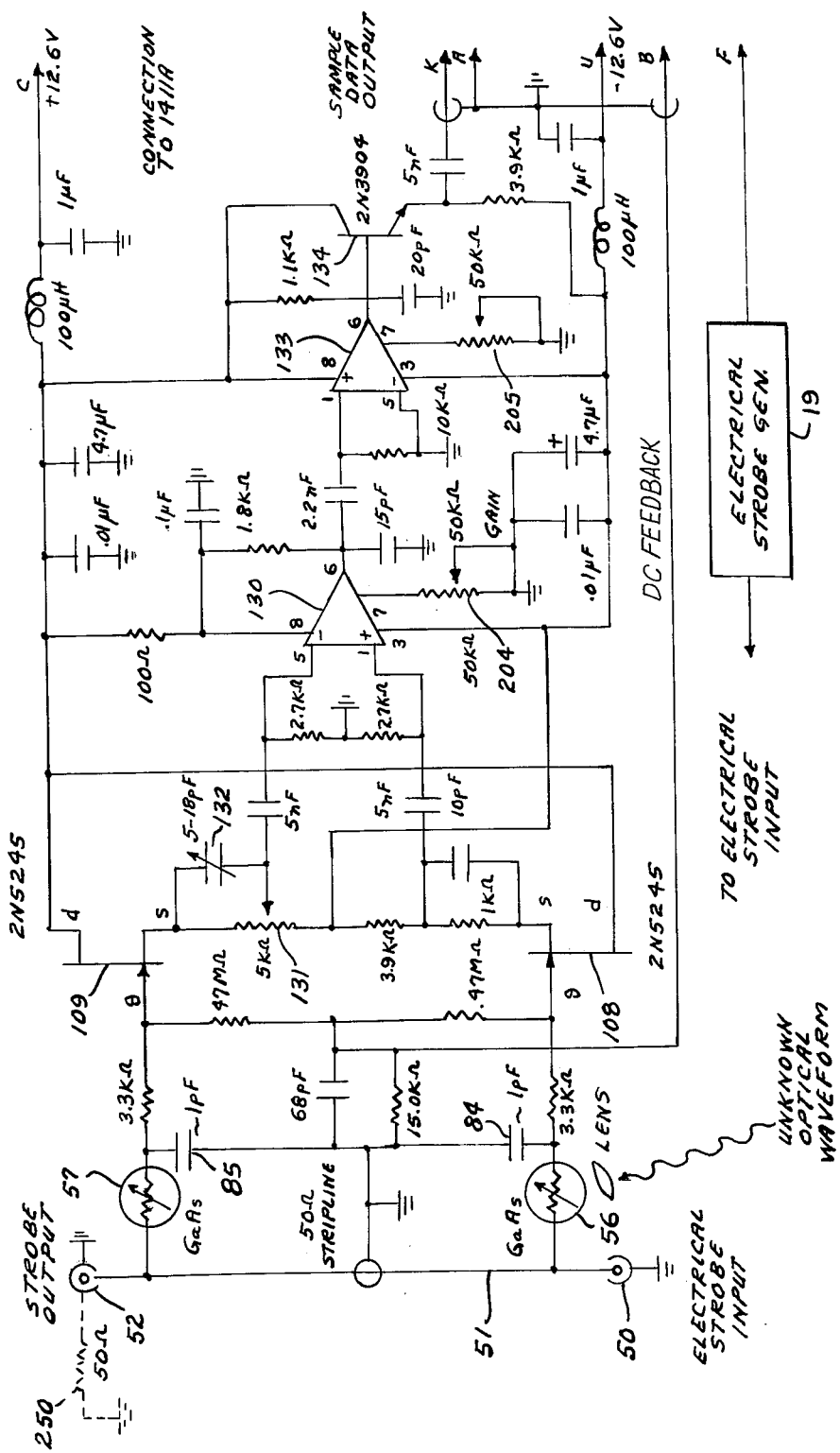
FIG. 17 is a detailed schematic wiring diagram of an embodiment of an electrically strobed sampling probe.

A detailed schematic diagram of the invention as used for sampling electrical signals is shown in FIG. 16 and for sampling optical signals in FIG. 17. The outputs from the photoconductor chip are amplified by high input impedance FET semiconductors 108 and 109. A high impedance amplifier is required by the sampling capacitor 84 and common mode compensating capacitor 85, which are actually stray wiring capacitances and of extremely low value, as previously mentioned.

The outputs from the FET amplifiers are fed to the plus and minus inputs of differential IC amplifier 130. The differential input of amplifying module 130 is used to cancel the common mode "blowby" signal. Since the probability of obtaining initially a perfectly balanced circuit is very small, variable resistor 131 and variable capacitor 132 provide adjustable means for adjusting the compensation to effect an improved balance. Integrated circuit module 133 provides additional amplification and transistor 134 provides a low impedance output to drive the 600 ohm forward attenuator in the vertical amplifier of conventional commercial sampling oscilloscopes. Conventional type CA3028A IC units are suitable for amplifiers 130 and 133. Typically the pre-amplifier provides a maximum gain of approximately 60dB with a bandwidth of approximately 40 kHz to 3.5 MHz.

Figure 18:
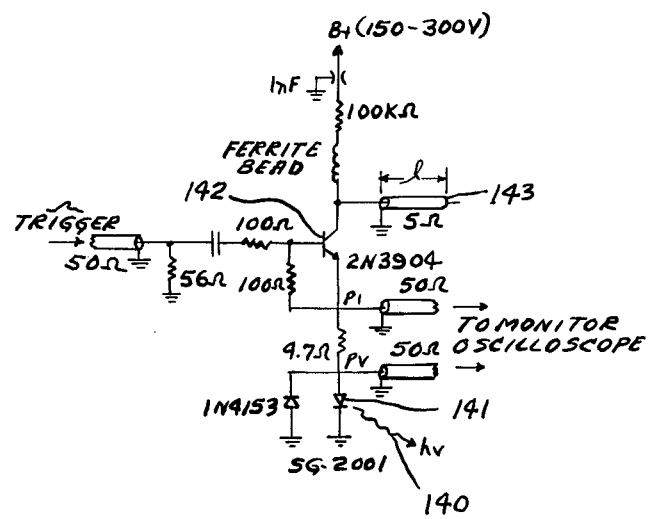
FIG. 18 is a simplified schematic diagram of an optical strobe pulse generator.

Typically, satisfactory optical strobe pulses to actuate the sampling photoconductor gate in the embodiments of the invention for examining electrical waveforms have peak powers of approximately one watt, approximately 100 picosecond rise times and 600 to 800 picosecond decay time constants. This will actuate a typical GaAs photoconductor, as previously described, which has approximately a 1000 Megohm dark resistance to a light resistance of approximately 40 K ohms. A brief schematic diagram of a suitable optical strobe generator is shown in FIG. 18, and as element 18 in FIG. 16. The optical strobe pulse 140 is generated by conventional GaAs laser diode 141. (Type SG2001 is an example of a laser diode that has been found suitable.) It is driven by avalanche transistor 142 which discharges the five ohm delay line 143 producing a ten ampere current pulse. The optical strobe pulse 140 is focused on the sampling photoconductor 56 by conventional lens 145. A more detailed description of this particular and suitable optical strobe pulse generator is contained in the previously mentioned reference published by James R. Andrews in the Review of Scientific Instruments, Vol. 45, No. 1, January 1974.

Figure 19:
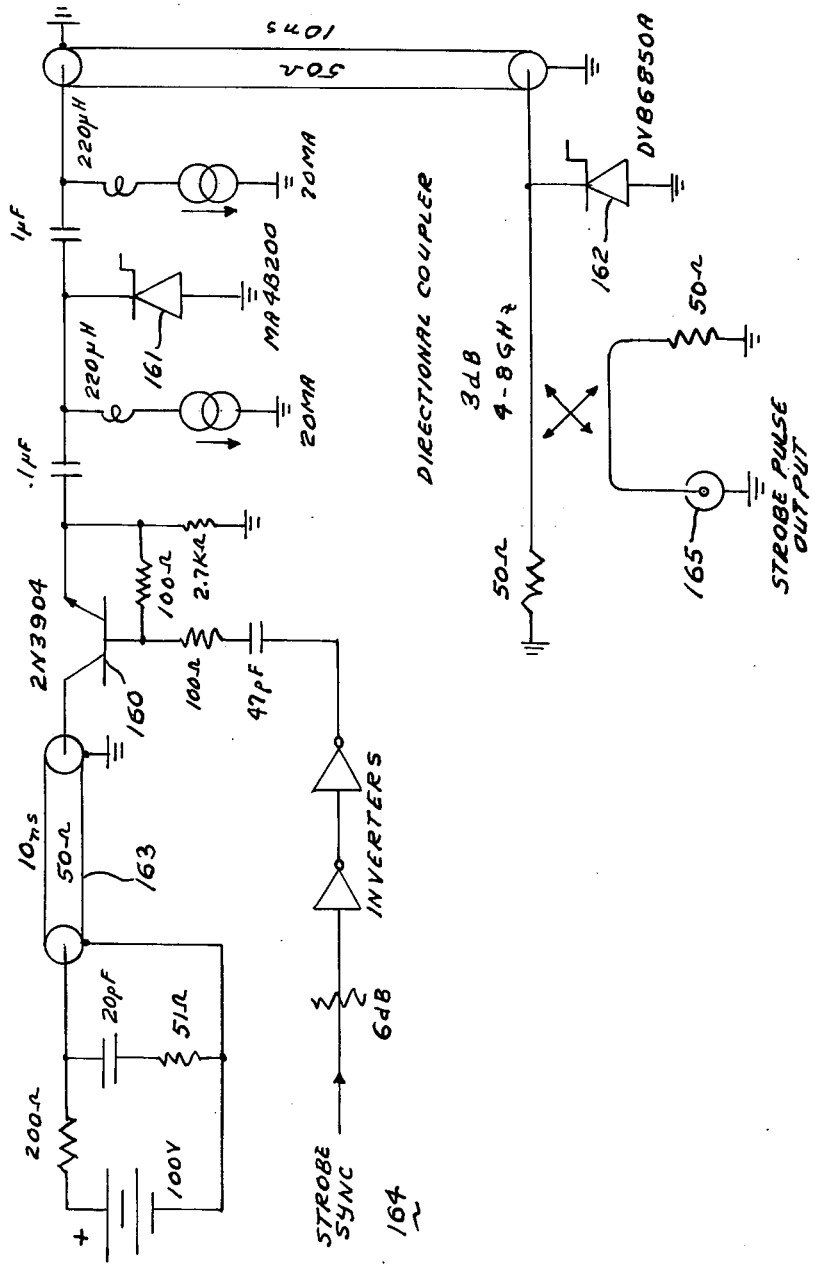
FIG. 19 is a simplified schematic diagram of an electrical strobe pulse generator.

For embodiments of the invention used in examining optical waveforms as schematically detailed in FIG. 17, it is desirable that the electrical strobe generator 19 have a 100 KHz maximum repetition rate, a 50 ohm source impedance, an extremely narrow 100, or less, duration impulse of approximately 8 volts, or greater, in amplitude, and a flat spectrum of at least 60 db $\mu$V/MHz up to 5 GHz. (It is to be understood that these suggested requirements set forth on the electrical strobe generator and the optical strobe generator are not requirements for operation, but preferred values to achieve the desired characteristics of the typical system being described in detail.) A suitable electrical strobe pulse generator is schematically diagrammed in FIG. 19. The generator's major components are the avalanche transistor 160 and two snap-off diodes 161 and 162. The transmission line 163 is initially charged to 100 volts. The positive strobe sync pulse 164 from the commercial sampling oscilloscope time base causes transistor 160 to go into avalanche breakdown, thus dicharging delay line 163 into diode 161. The leading edge of the pulse from transistor 160 is sharpened by the snap-off action of diode 161 and diode 162. The risetime of the step-like pulse from diode 612 is of the order of 60 ps. The leading edge of this pulse is differentiated by the directional coupler into the electrical strobe output pulse at connector 165. The typical strobe amplitude is 11.6 volts and the duration (50level) is approximately 85 ps. A suitable electrical strobe generator is disclosed in the previously mentioned published reference, James R. Andrews and Eugene E. Baldwin, "Baseland Impulse Generator Useful to 5 GHz", 1975 IEEE Electromagnetic Compatibility Symposium Record, October 1975, pages 6BId1 to 6BId4.

The waveform sampler herein disclosed will function with conventional sampling oscilloscopes having electrical connecting provisions for receiving a sample data signal input, providing a dc feedback control voltage, providing a strobe sync pulse output, and receiving an external trigger input to a sampling time base, such as diagrammed in simplified schematic form in FIG. 5. Generally, these are common connections for practically all sampling oscilloscopes. Whether the dc power, i.e., the +12.6 volts and −12.6 volts used by the particular embodiment described in detail is readily available from the connections on the oscilloscope is not critical. The components may, if it is more convenient, be powered from a separate power supply source or batteries. It is also to be understood that while GaAs has been found to be the generally preferred photoconductive material, that other conventional photoconductive materials will operate at a somewhat lesser degree of satisfaction. Also, both the particular optical strobe pulse generator and the electrical strobe pulse generator described herein are not a critical requirement to the operation of the invention and that those skilled in the art will readily utilize other strobe pulse generators that will meet their particular characteristic requirements of system operation.

Figure 20:
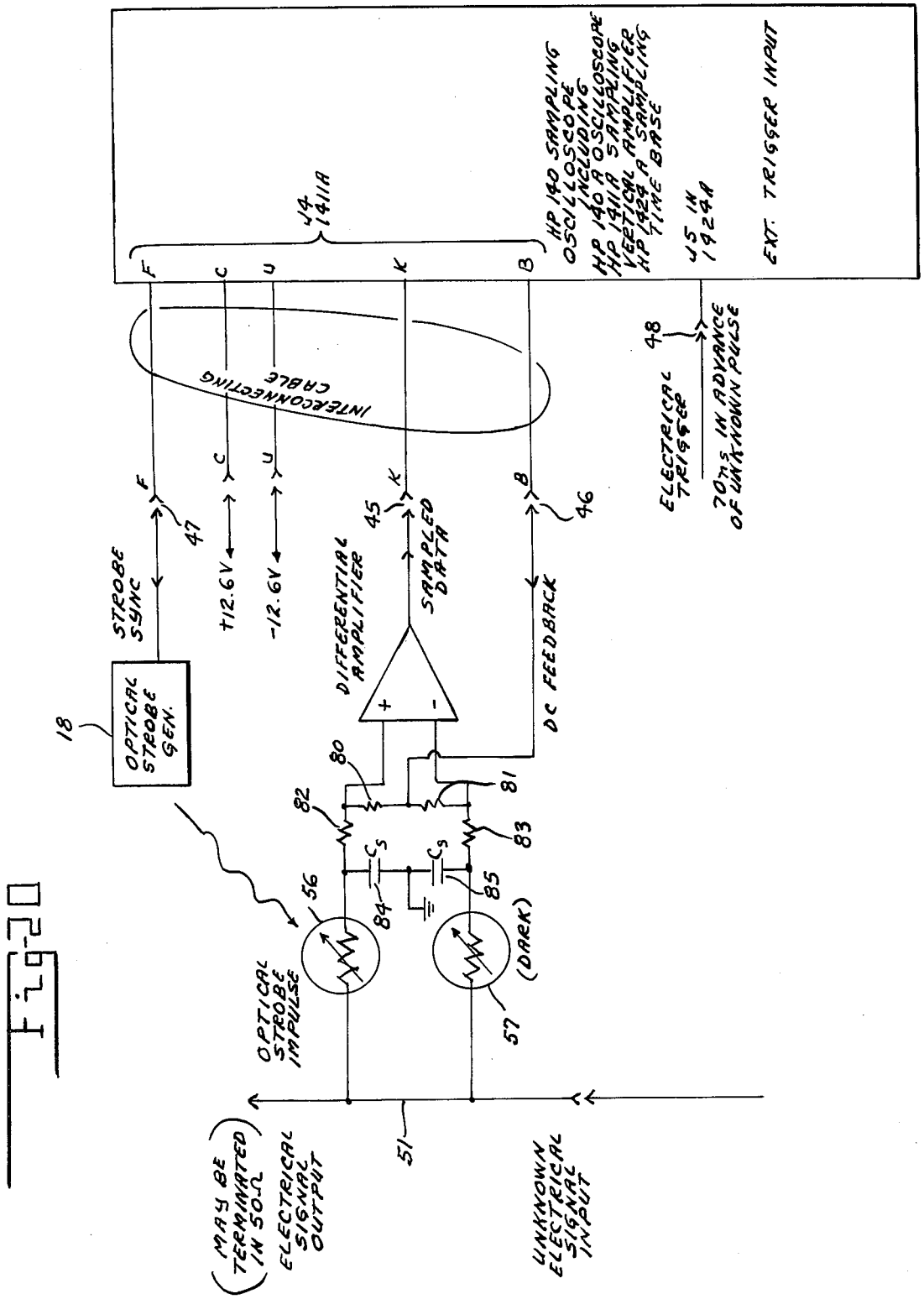
FIG. 20 is a simplified block schematic diagram showing the interconnections of an embodiment of an optical strobed sampler with a conventional sampling oscilloscope.
Figure 21:
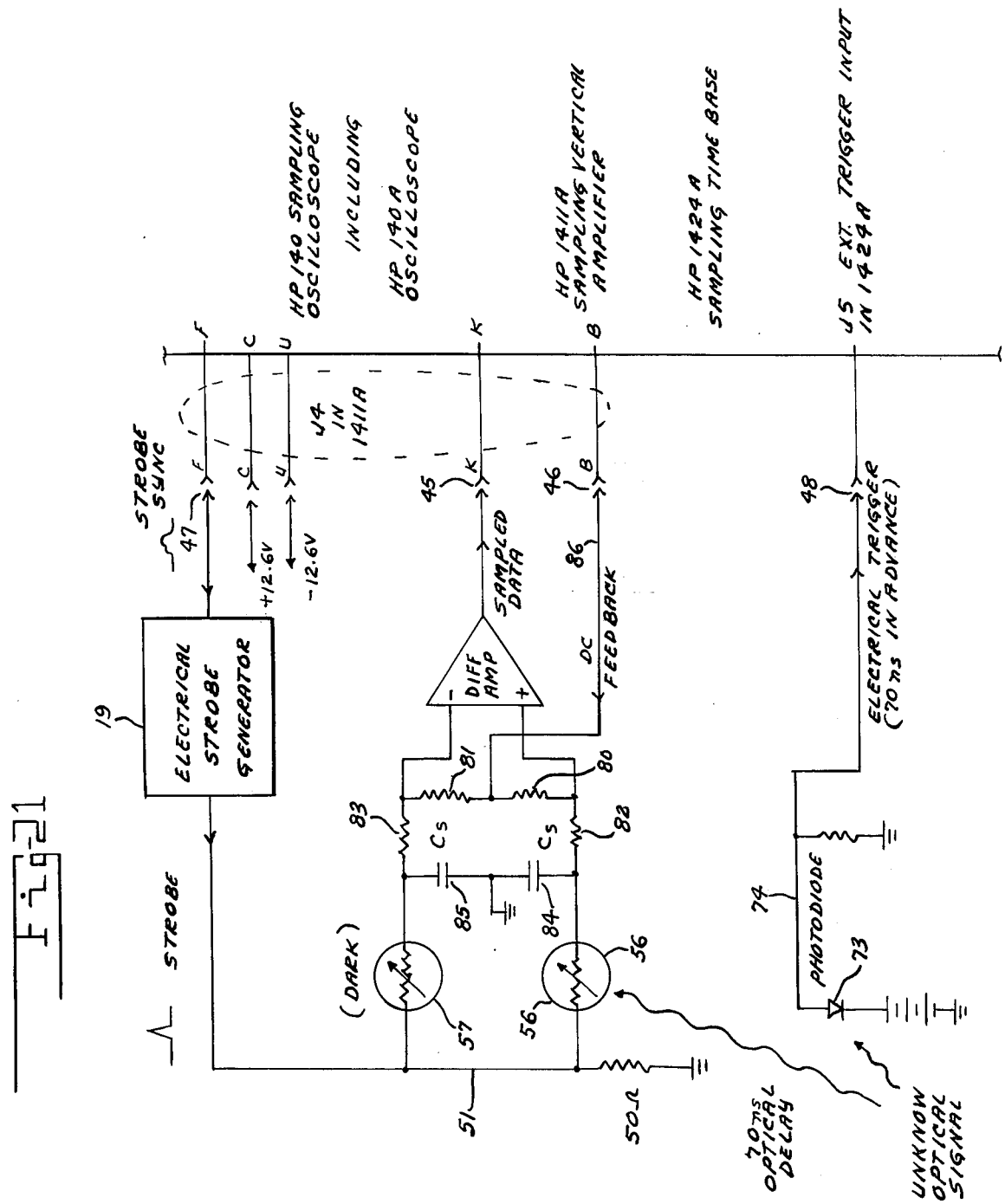
FIG. 21 is a simplified block schematic diagram showing the interconnections of an electrically strobed embodiment of the invention with a conventional sampling oscilloscope.

A particular sampling oscilloscope system that is suitable for operation with the disclosed waveform sampler is the commercially available Hewlett-Packard sampling oscilloscope system. The lettered connections C, K, A, U, B, and F on FIGS. 16 and 17 refer to lettered terminal connections to this particular oscilloscope system. FIGS. 20 and 21 show in greater detail the connections between the apparatus of this invention and this particular commercial sampling oscillscope. In the simplified schematic diagrams of FIGS. 20 and 21, the representative differential amplifier circuit element is presumed to contain all the applicable circuitry of FIGS. 16 and 17.

To further aid those practicing this invention the suggested tune-up procedure of the apparatus of the invention when used in connection with the Hewlett-Packard sampling oscilloscope equipment as diagrammed in FIGS. 20 and 21 is as follows:

I. For the optically strobed, electrical waveform sampler. (Refer to FIGS. 16 and 20.)
  A. Adjusting the Common-Mode Rejection.
  1. Disable the laser by disconnecting resistor 201 from the dc supply voltage 202.
  2. Connect a pulse or square wave (∼100KHz) generator to the electrical signal input connector 50.
  3. Connect a monitor oscilloscope to the sampler output, pin K from capacitor 203.
  4. Externally trigger the monitor oscilloscope from the pulse generator.
  5. Ground the dc feedback line, pin B.
  6. Set IC130 and IC133 gain controls, 204 and 205, to maximum gain setting.
  7. Turn on the H-P 140 scope.
  8. Adjust common mode rejection adjustments, resistor 131 and capacitor 132, to minimize the signal at pin K as observed on the monitor oscilloscope.
  B. Adjusting the Laser Strobe Pulse Generator 18.
  1. Connect a monitor oscilloscope to the emitter of transistor 142.
  2. Disconnect the strobe sync line 208 from pin F.
  3. Connect a pulse generator to the disconnected line >5v, $t_r$ <10 ns) to externally sync the laser pulse generator. $F_{max}$ = 5 KHz.
  4. Externally trigger the monitor oscilloscope from the pulse generator.
  5. Connect resistor 201 to the adjustable dc power supply 202.
  6. Slowly increase the power supply voltage while observing the monitor oscilloscope.
  7. When the avalanche breakdown voltage, $BV_{cer}$, is reached, a large pulse, typically 25–50 volts in amplitude will suddenly appear at the emitter of transistor 142. Typ. $BV_{cer}$ = 130.
  8. Set the supply voltage at $BV_{cer}$+5 volts.
  9. Verify that transistor 142 is operating stably, i.e., pulsing in sync with the external pulse generator and not free-running.
  10. With an infrared convertor, visually observe the laser diode 141 to verify that it is emitting infrared light.
  11. With the aid of the infrared convertor, adjust the position of the laser diode 141 and the lens 145 so that the beam of light from the laser is tightly focused into a small spot illuminating the sampling photoconductor through the hole in the stripline board.
  12. Connect the monitor oscilloscope to pin K.
  13. Apply a dc voltage (1–10V) to the electrical signal input 50.
  14. Adjust the focus and position of the laser beam on the sampling photoconductor to maximize the signal at pin K.
  C. Sampling Efficiency Adjustment.
  1. Remove the pulse generator from line 208 and reconnect it to the sampling oscilloscope strobe sync line, pin F.
  2. Remove the ground wire from the dc feedback, pin B.
  3. Set IC130 and IC133 gain controls, 204 and 205, to approximately ¼ turn from minimum gain.
  4. Connect a conventional pulse generator to the electrical signal input connection 50 (1 volt, $t_{rise}$ <10 ns, $t_{width}$ >1µs, $f_{max}$ <5 KHz), and the triggerout of the pulse generator to the trigger input of the sampling oscilloscope.
  5. Adjust the sampling oscilloscope controls as follows:
    Vertical Scale Factor: 200 mV/cm
    Horizontal Scale Factor: 10 ns/cm
    Trigger Controls: as necessary for stable triggering
    Sampling Dot Density: minimum
  6. Set the sampling oscilloscope, sampling vertical amplifier gain (on the H-P 1411A it is called "Smoothing Adj.") to the maximum gain.

7. Observe the resultant sampled waveform on the CRT screen. With the pulse generator waveform as shown in FIG. 22 the sampled waveform will appear as either FIG. 23, 24, or 25.

8. Adjust the sampler gain controls, resistor 204 and/or resistor 205, as necessary to obtain 100% sampling efficiency as shown in FIG. 23. If the CRT display is similar to FIG. 24 then additional gain is required. Likewise if the CRT display is similar to FIG. 25 the gain must be reduced.

II. For the Electrically Strobed, Optical Waveform Sampler. (Refer to FIGS. 17, 19 and 21.)

1. Initial tune-up is the same as for optically strobed, electrical waveform sampler, i.e., proceed through previous steps A, B, and C.

2. Remove laser diode pulse generator from the equipment setup.

3. Connect strobe sync, pin F, to external input of impulse generator 19 through the 6d$\beta$ attenuator.

4. Set impulse generator 19 repetition rate switch to the EXT position.

5. Connect the impulse generator 19 output to the sampler electrical signal input 50.

6. Connect a 50 ohm termination 250 to the electrical signal output of the sampler 52.

7. In operation the optical signal is precisely focused onto the sampling photoconductor. To obtain stable operation, it may be necessary to increase or decrease the sampler gain depending upon the incident light level.

We claim:

1. A waveform sampler comprising:
   a. an electrical transmission line having a center conductor and an electrical signal input connection and an electrical signal output connection;
   b. a chip of photoconductive material having a first and a second electrical contact forming a first photoconductor therebetween and providing a first electrical signal output and a third and fourth electrical contact forming a second photoconductor therebetween, and providing a second electrical signal output;
   c. means for positioning the said chip of photoconductive material such that the said first and said third electrical contacts of the chip are in electrical contact with the said center conductor;
   d. means for illuminating the said first photoconductor; and
   e. means cooperating with the said first and the said second electrical output signals for providing an electrical signal proportional to the difference in the said first and the said second electrical signals.

2. The waveform sampler as claimed in claim 1 wherein the said electrical transmission line is a stripline and the said photoconductive material is GaAs.

3. A optically strobed electrical waveform sampler for sampling an electrical wave comprising:
   a. a 50 ohm stripline transmission line having a center conductor receiving the said electrical wave;
   b. a chip of GaAs photoconductive material having a first and a second electrical contact forming a first photoconductor therebetween and providing a first electrical signal output, and a third and a fourth electrical contact forming a second photoconductor therebetween and providing a second electrical signal output;
   c. means for positioning the said first and third electrical contacts of the said chip in electrical contact with the said center conductor of the said stripline;
   d. means for optically strobing the said first photoconductor; and
   e. means cooperating with the outputs of the said first and the said second photoconductors for providing a difference signal proportional to the difference between the said first output signal and the said second output signal.

4. The sampler as claimed in claim 3 wherein means for displaying the said difference signal is included.

5. An electrically strobed optical waveform sampler for sampling an optical wave, comprising:
   a. a fifty ohm stripline transmission line having a center conductor and an input connection and an output connection;
   b. means for terminating the said stripline at the said output connection;
   c. an electrical strobe generator for providing electrical strobe pulses;
   d. means for connecting the said electrical strobe generator to the said input connection of the said stripline;
   e. a chip of GaAs photoconductive material having a first and a second electrical contact forming a first photoconductor therebetween and providing a first electrical signal output, and a third and a fourth electrical contact forming a second photoconductor therebetween and providing a second electrical signal output;
   f. means for positioning the said first and third electrical contacts of the said chip in electrical contact with the said center conductor of the said stripline;
   g. means for focusing the said optical wave on the said first photoconductor; and
   h. means cooperating with the said first and second electrical output signals from the said first and second photoconductors providing a difference signal proportional to the difference in the said first and second electrical output signals.

6. The optical wave sampler as claimed in claim 5 wherein an additional means for displaying the said differnce signal is provided.

* * * * *

UNITED STATES PATENT OFFICE
CERTIFICATE OF CORRECTION

Patent No. 4,030,840            Dated June 21, 1977

Inventor(s) Robert A. Lawton and James R. Andrews

It is certified that error appears in the above-identified patent and that said Letters Patent are hereby corrected as shown below:

Col. 4, line 31, change "once" to -- one --. Col. 5, line 13, change "by" to -- be --. Col. 7, line 54, change "shon" to -- shown --. Col. 8, line 56 between "100" and the "," insert -- ps --. Col. 9, line 7, change "612" to -- 162 --; line 12, change "(50level)" to -- (50% level) --.

Signed and Sealed this

Fifteenth Day of November 1977

[SEAL]

Attest:

RUTH C. MASON
Attesting Officer

LUTRELLE F. PARKER
Acting Commissioner of Patents and Trademarks